United States Patent [19]

Sullivan

[11] Patent Number: 4,657,839
[45] Date of Patent: Apr. 14, 1987

[54] PHOTOPRINTING PROCESS AND APPARATUS FOR EXPOSING PASTE-CONSISTENCY PHOTOPOLYMERS

[76] Inventor: Donald F. Sullivan, 115 Cambridge Rd., King of Prussia, Pa. 19406

[21] Appl. No.: 526,455

[22] Filed: Aug. 25, 1983

Related U.S. Application Data

[60] Continuation-in-part of Ser. No. 313,609, Oct. 21, 1987, Pat. No. 4,424,089, which is a division of Ser. No. 147,726, May 8, 1980.

[51] Int. Cl.⁴ .................... G03C 1/74; G03C 5/16; G03C 11/12; G03C 9/00
[52] U.S. Cl. .................... 430/258; 430/327; 430/325; 430/311; 430/260; 430/396; 430/271; 430/277
[58] Field of Search ............. 430/327, 325, 311, 258, 430/260, 396, 271, 277

[56] References Cited

U.S. PATENT DOCUMENTS

| | | | |
|---|---|---|---|
| 2,760,863 | 8/1956 | Plambeck | 430/281 X |
| 3,629,036 | 12/1971 | Isaacson | 430/260 X |
| 3,837,887 | 9/1974 | Akamatsu et al. | 430/270 |
| 3,848,998 | 11/1974 | Yonekura et al. | |
| 4,002,478 | 1/1977 | Kokawa et al. | 430/258 |
| 4,052,603 | 10/1977 | Karlson | 364/120 |
| 4,070,110 | 1/1978 | Ott | 355/100 |
| 4,087,182 | 5/1978 | Aiba et al. | 355/100 |
| 4,127,436 | 11/1978 | Friel | 156/630 |
| 4,230,793 | 10/1980 | Losert et al. | 430/315 |
| 4,260,675 | 4/1981 | Sullivan | 430/315 |
| 4,268,602 | 5/1981 | Yoshino et al. | 430/327 X |
| 4,291,118 | 9/1981 | Boduch et al. | 430/327 |

FOREIGN PATENT DOCUMENTS

| | | | |
|---|---|---|---|
| 0027603 | 4/1981 | European Pat. Off. | 430/327 |
| 2812083 | 7/1979 | Fed. Rep. of Germany | 430/396 |
| 741470 | 12/1955 | United Kingdom | 430/396 |

OTHER PUBLICATIONS

Ewald Fred Noemer, *The Handbook of Modern Halftone Photography with Complete Concepts and Practices*, 6th ed., Perfect-Graphic-Arts Supply Company, Demarest, N.J., 1975, pp. 1-2,5,30-31.
J. Gasper and J. J. DePalma, "Optical Properties of the Photographic Emulsion", Chapter 20 of *The Theory of the Photographic Process* (4th ed.), T. H. James, ed., Macmillan Publishing Co., Inc., New York, N.Y., 1977, p. 601.
W. S. DeForest, *Photoresist Materials and Processes*, McGraw-Hill Book Company, New York, N.Y., 1975, p. 119.
Thomas A. Richter and George B. Collins, "Comparing UV Exposure Systems for PCBs: Contact, Off-Contact and Projection Systems", *Circuits Manufacturing*, vol. 19, No. 11, 1979, pp. 69, 117-119.
M. D. Palmer, Photomask Protection by Oleophobic Films", *IBM Disclosure Bulletin*, vol. 16, No. 7, p. 2319, Dec. 1973.

*Primary Examiner*—John E. Kittle
*Assistant Examiner*—Cynthia H. Hamilton
*Attorney, Agent, or Firm*—Laurence R. Brown

[57] ABSTRACT

Improved resolution in a low cost non-critical photopolymer printing process is achieved by a non-volatile liquid image quality photopolymer layer disposed with air free surfaces sandwiched between two carrier surfaces, one being transparent and carrying a transparency image in contact with the liquid photopolymer to be exposed by radiation to cure the layer and produce the image pattern. In a typical example, paste-consistency photopolymer is imaged onto printed wiring boards by coating the board overall and positioning the photographic film over the board in register and off-contact. A resilient blade is pressed against the phototool at one end of the board and drawn across the surface, thus forcing the photographic film into intimate contact with the photopolymer and purging all air therebetween. Mounted on the resilient blade aft of leading edge is a shuttered tubular lamp which hardens the photopolymer where the photographic film is clear, so that in a single pass the photographic film is sequentially mated and photopolymer exposed, to produce line widths unmatched by competing dry film systems and at speeds of 0.5 feet per second. Film thicknesses from 0.006 mm to 0.05 mm can give resolutions for line widths and spacings as fine as 0.076 mm.

21 Claims, 2 Drawing Figures

PHOTOPRINTING PROCESS AND APPARATUS FOR EXPOSING PASTE-CONSISTENCY PHOTOPOLYMERS

BACKGROUND ART

This is a continuation-in-part of my copending application U.S. Ser. No. 313,609 filed Oct. 21, 1981, now U.S. Pat. No. 4,424,089 dated Jan. 3, 1984, which in turn is a division of U.S. Ser. No. 147,726 filed May 8, 1980.

TECHNICAL FIELD

This invention relates to a photoimaging process and apparatus for producing images of high fidelity on substrates, particularly the formation of conductor patterns on printed wiring boards, graphic images on meter faces, precision four-color half-tone graphic, and the like, from paste-consistency photopolymers.

This disclosure teaches a new process and apparatus for producing graphic images on substrates, using photopolymers such as paste-consistency ultraviolet light (UV) curable photopolymers. These photopolymers are characterized by their composition of 100 percent reactive polymers, which are transformed from a paste-consistency wet film to a dry coating by exposure to a strong UV light source for several seconds. The photopolymers as used in the disclosed process are further characterized as being imaging quality, or capable of being selectively hardened by light passing through a photographic master, thereby producing a film securely affixed to a substrate, at locations where the photographic master allows the UV light to impinge on the photopolymer.

The photopolymers which can be imaged by the disclosed process and apparatus are of known composition, a representative list being included herein. These photopolymers are available commercially as plating resists and as etch resists for use in printed wiring board (PWB) manufacture, for example. These photopolymers are also used extensively in graphics imaging and are being applied conventionally by screen printing.

This class of photopolymers has been developed to be applied to substrates via screen printing, wherein the images are deposited on the substrates as wet photopolymer, and are then hardened and transformed into permanent images by being subjected to a strong UV light source.

The screen printed photopolymer images are characterized by indistinct boundaries, loss of fidelity, smeared images and limited film thickness, not so much because of the photopolymer viscosity characteristics as the inherent limitations of screen printing art as achieved in a production environment by semi-skilled printers.

The images which can be achieved using the disclosed process and apparatus and the same photopolymers are characterized by lines having sharp, distinct boundaries, exceptional fidelity with film thicknesses up to 0.002 inches (0.05 mm) and no smearing. For example, screen printed PWB resist patterns are practically limited to conductor widths and spacing of 0.010 inches (2.54 mm) minimum, while the same photopolymers can be imaged as disclosed herein to produce line widths and spacings of 0.003 inches (0.076 mm), with a film thickness of 0.00025 inches (0.006 mm).

Screen printed half-tone images are limited to a practical upper range of 105 lines per inch, with dot sizes of 20 to 80 percent. The same photopolymer imaged as described herein can produce half-tone graphics of 150 lines, with dot sizes of 5 to 95 percent.

In addition to improving on the quality of images produced by screen printing, the disclosed process and apparatus produces superior images as compared with images produced by the dry film photoresists such as in widespread use in the manufacture of printed wiring boards.

Dry film photoresists are laminated onto the PWB by heat and roller pressure; exposed to a UV light source through a photo image, hardening the exposed photopolymer to the extent that the subsequent solvent washout step ideally removes only unexposed photopolymer. The images produced are of excellent definition, having distinct boundaries uniform thickness and a resolution down to 0.005 inches (0.13 mm) line widths. Dry film photoresist images are expensive to produce owing to the cost of photopolymer, the necessity to discard twice as much plastic carrier film as applied photopolymer; and the need for expensive laminating, exposing and washout equipment.

In addition to screen printed images and dry film photoresist images, a third imaging method is known but not in widespread use, wherein PWB solder mask coatings are photoimaged by the Bell Laboratories. The process consists of roller coating the PWB surface with solder mask photopolymer, laminating a thin plastic sheet thereover and exposing the photopolymer through a phototool via a collimated light source. Use of atmospheric pressure to force the phototool into intimate contact with the thin plastic sheet would force or extrude the photopolymer into the drilled holes, and thins out the coating on the printed wiring. The thin plastic sheet also separates the emulsion of the phototool from the surface of the photopolymer so that loss of fidelity is experienced because of light undercutting.

While this invention is advantageous in making printed wiring boards (PWB), it also in the same manner produces high resolution half-tone or line printing plates, with very simple equipment which is readily automated as compared with prior art systems.

Exemplary prior art for preparation of photopolymer printing plates includes U.S. Pat. No. 4,070,110—J. W. Ott, Jan. 24, 1978 for producing photopolymer relief printing plates in a semi-automated process. Thus a sandwich array is prepared by laminating a cover film and backing sheet with intermediate photopolymer applied in liquid form and hardened by partial exposure to light. The sandwich is after being completed formed, flattened under pressure, while exposing through the phototransparencies. A complex machine array for a similar laminating and followthrough development process is shown also in U.S. Pat. No. 4,087,182—H. Aiba et al., May 2, 1978. These are contact printing processes as compared with a photo imaging process such as described in U.S. Pat. No. 4,052,603—K. Karlson, Oct. 4, 1977.

All of these involve complex and expensive machinery and do not result in simple single pass lamination and exposure scanning as does the present invention.

My U.S. Pat. No. 4,260,675 of Apr. 7, 1981 employs liquid photopolymers for preparing printed circuit board solder masks wherein a relief pattern of posts physically pushes aside the liquid photopolymer before exposure in those places where solder is to adhere to the circuit board conductors.

Other methods of sandwiching and developing photopolymer plates have been devised such as set forth in U.S. Pat. No. 3,848,998—S. Yonekura et al., Nov. 19, 1974 using rigid plates.

However, rigid plates cannot be used to achieve desired high resolution because of the difficulty at low expense to achieve optically flat surfaces and the dependency upon a uniform thickness and very smooth surface on the photopolymer being exposed.

Therefore the present invention has as a general object, the simplicity and improvement of prior art equipment and processes for producing printed elements of high resolution with photopolymers.

Another object of the invention is to resolve a number of problems in the art including those now briefly discussed.

In the prior state of the photopolymer printing arts considerable time and expense is involved in heating and cooling photopolymers between various steps to soften, to adhere, to develop, etc. These problems are resolved by the present invention by reducing the exposure time to reduce the heat and energy requirements by exclusion of air from the photopolymer surfaces during exposure, and by simplifying the process to require fewer steps, fewer layers of film, etc. Expensive collimated radiation sources have been required in exposing photopolymers.

Selective adherence and non-adherence of photopolymer films at different stages of the photo process has been a difficult problem. For example, a dry film need be heated to adhere properly to a substrate without air bubbles, etc. This invention can resolve this adherence problem by spreading paste-consistency liquid photopolymers over the substrate surfaces. Also, when dry film hardening agents are involved they are difficult to remove in the development stage. By using a photo cycle of hardening liquid polymers, the unexposed liquid is easy to wash out of eyelet holes, etc. and simplifies the development step. Also solvents are less apt to undercut exposed polymer to reduce definition. Thinner films of liquid photopolymer save polymer costs and result in better resolution.

Complex sandwiches involving protective films over dry polymer films are costly and time consuming in manufacture and stripping for use. Also they are not conducive to positioning of other layers on their surface for exact registration.

The use of liquid consistency photopolymers has not been feasible in many applications because of thinning over circuit traces or seeping into eyelets or causing fisheyes in contact with non-wetting surfaces which can be stripped from the polymer or because of sticking in part to build-up ridges. In accordance with this invention these various problems are simply resolved by a simple low-cost, photo medium with attendant advantages of being easy to process with low power uncollimated light and less labor and yet giving higher resolution, a result entirely unobvious and unexpected.

An objective of this invention is to provide a new industrial process and apparatus which will significantly improve the art of image formation on substrates, in which a significant image thickness is required, through the use of photopolymers which are applied in the wet state and converted to a hardened polymerized state by exposure to light.

Another objective is to provide a significant improvement in attained image resolution over known competing imaging processes.

A further objective is to specify materials and processes which will greatly reduce the waste of resources associated with dry film resists. For every square foot of dry film photopolymer applied to PWB surfaces, two square feet of polyester and polyolefin film are wasted. The disclosed technique wastes no film and no photopolymer.

Another objective is the use of apparatus and photopolymers which greatly reduce the total cost of image formation, by use of less expensive equipment, less expensive photopolymer and by increasing the productivity of personnel.

Another objective is to be able to image substrates which can presently be done only by screen printing because of substrate size or thickness, in which the inherent limitations of screened printing are overcome, including Moire patterns in half-tone images and limited resolution of line images.

This disclosure also teaches improved methods for processing the wet photopolymer coatings to achieve the precision images detailed herein.

One objective is to mate the photopolymer-coated phototool with the substrate so as to exclude air from the photopolymer.

Another objective is to speed up the normal exposure cycle of dry film photoresists consisting of vacuum drawdown then exposure.

Another objective is to provide a way to coat a non-wetting surface, in such a way that the applied photopolymer does not develop fish-eyes or voids.

DISCLOSURE OF THE INVENTION

The disclosed apparatus mates one area of the PWB and phototool while a previously-mated area is being exposed, so that on a single scan the mating and exposure is accomplished without external vacuum source.

The process consists of the steps of preparing a phototool (or photomask) which describes the images to be reproduced, with clear areas of a non-stick material on the substrate-facing surface; the coating of the phototool with a thin layer of photopolymer; the partial polymerization of the photopolymer to prevent de-wetting on non-stick phototool areas; the placement of the phototool above and off-contact to the substrate being imaged; the mating of the phototool with the substrate so as to exclude all air by use df a resilient blade drawn across the topside of the phototool; the selective exposure of the photopolymer through the phototool by a tubular mercury vapor lamp which traverses the phototool just behind the resilient blade. Thus, in one pass, images are produced at a scan rate of one foot (0.3 M) per 2 seconds. Following exposure, the substrate is peeled away from the phototool and subjected to a solvent spray removing unhardened photopolymer, leaving the desired image securely affixed to the substrate.

The described process and disclosed apparatus enables images of exceptional resolution to be generated, using many available photopolymers, generally described as UV-curing photopolymers. These photopolymers are currently being applied by screen printing and cured by UV radiation, for imaging printed wiring boards, for printing meter faces, name plates and screen-printed four color graphics. When these photopolymers are processed in accordance with this disclosure the images generated will faithfully reproduce phototool details, including lines having widths and separations of three-thousandths of an inch (0.076 mm). Further, images composed of half-tone dot patterns of 150 lines, from 5% to 95% can be faithfully reproduced.

The described processes and apparatus are capable of providing these images with a film thickness of 0.25 thousandths of an inch (0.006 mm), while film thickness of over 2 thousandths of an inch (0.05 mm) can be produced with some decrease in resolution.

BRIEF DESCRIPTION OF THE DRAWINGS

Further background, objects, advantages and features of the invention will be set forth throughout the following specification with reference to the accompanying drawings wherein.

DESCRIPTION OF THE PREFERRED EMBODIMENTS

Figure 1:
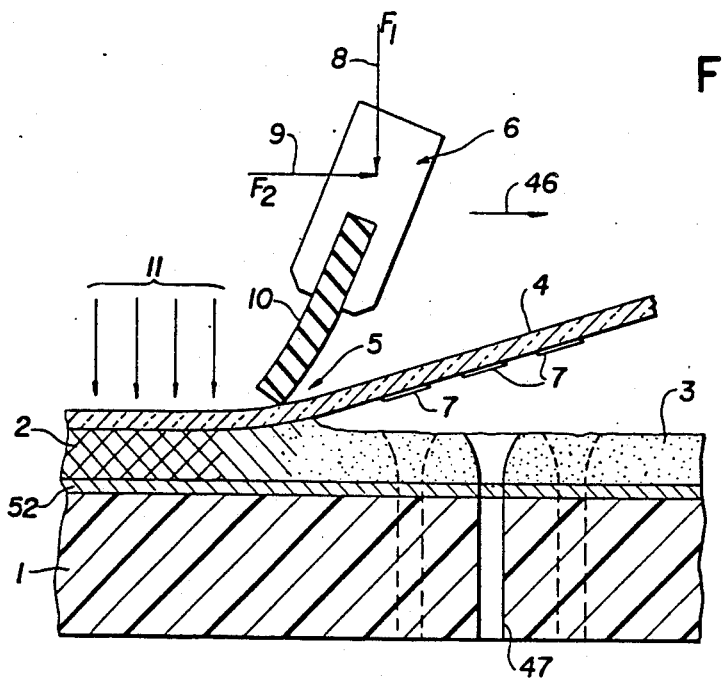
FIG. 1 is a diagrammatic side view sketch, partly sectioned to illustrate the mating of a photo image with a coated substrate by use of a resilient blade as provided by this invention.

This detailed description begins with a technical description of the manufacturing requirements for PWB imaging, including image sharpness, resist uniformity in thickness; registration (accuracy of placement) and hole tenting. Also the light intensity requirements of the UV curable photopolymers to achieve polymerization is defined.

Next, this detailed description illustrates the techniques for mating the coated phototool with a copper-clad printed wiring board; the near-simultaneous technique for curing; the selection of high temperature photo imaging means hereinafter termed a phototool, followed by the preferred embodiment for production printed wiring board imaging.

Throughout this disclosure the process of joining together the substrate, the photopolymer and the phototool into a unified assembly is referred to as mating.

IMAGING

Computer grade PC boards are typically manufactured in panel form in sizes of the order of 18 by 20 inches (0.46 M by 0.5 M). Conductor lines and spaces are of the order of 0.010 inches wide (0.025 cm) with sharply defined edges, free of nicks and bulges. Additionally, the imaging resist forming the conductors must maintain a constant thickness, consistent with the plating or etching chemicals, temperature and immersion time. Too thin a resist results in breakdowns and the plating of metal at unwanted locations.

With regard to image placement on the copper-clad board, the 18 by 20 inch (0.46 M by 0.5 M) panel will typically have an accuracy of 0.002 inches (0.05 mm) on drilled hole location, requiring that the imaging be accurate to within 0.005 inches (0.13 mm) in order to maintain an annular ring of the order of 0.005 inches (0.13 mm) around the hole.

Curing

As described earlier, the UV curable photopolymers used in PWB manufacture have been developed to be applied by screen printing over the copper surface and cured by conveying under 200 watt-per inch mercury vapor lamps at a speed of 12 feet (3.66 M) per minute. The surface temperature rise is significant, for the board receives approximately 200 watt-seconds of energy per square inch of area. Typically, surface temperatures in excess of 300 degrees F. are experienced. The aforementioned 200 watt-seconds per square inch (6.45 cm$^2$) energy requirement is for photopolymer whose surface is exposed to air. Most all of the tested photopolymers are affected by air to the extent that the exposure energy can be reduced to only 50 watt-seconds per square inch (6.45 square cm) when the air is completely excluded by the mating process described herein.

Phototool Mating

A phototool, as used herein, is a transparent sheet with light opaque areas corresponding to the image to be reproduced, and this phototool is placed between the UV lamp and the substrate to control those areas of photopolymer to be hardened. The terms photo image, photomask and phototool can be used interchangeably.

While it is possible to image the coated PWB with the phototool off-contact, it is not cost-effective, since an expensive collimated light source is required; other light sources will produce light undercutting, reduced line widths, and loss of line fidelity.

In order to use a non-collimated light source and still achieve fine line imaging, it is necessary for the phototool to intimately contact the photopolymer, as is accomplished herein.

FIG. 1 shows a section of a PWB 1 in which the phototool is being mated to the coated surface 3. PWB 1 has been previously roughly coated with photopolymer layer 3. Phototool 4 is positioned above and off contact with PWB 1 with opaque areas 7 registered to drilled holes 47 in the PWB 1. Assembly 6 movable in the direction of arrow 46 has rubber blade 10 of 50 durometer, which traverses the top surface of phototool 4. Force $F_1$ in direction 8 on phototool 4 causes the phototool to contact the photopolymer and force $F_2$ in the direction of movement 9 causes blade 10 to traverse the topside of the phototool and progressively mate the phototool with the photopolymer.

This technique purges the photopolymer of air bubbles which may have been entrapped during the coating cycle, and also prevents the entrapment of air resident between the phototool and photopolymer surface.

This mating technique has several highly desirable features not readily obtainable otherwise. First, the photopolymer surface, when coated, may be mottled or have an orange-peel effect. These surface irregularities are smoothed out and the mated surface conforms to the smooth plastic surface topology of phototool 4 as well as the substrate. In the case of a PWB the substrate carries a copper layer 52 surface which is to be conformed to the image of the phototool 4, for example. This is illustrated in FIG. 1 with cross-hatched photopolymer area 2 being in surface to surface contact because of the previous scanning of surface contact member 10, preferably a rubber blade, across the phototool 4 surface.

While this mating technique smoothes out surface irregularities, there is no tendency for the photopolymer to be forced out ahead of the blade and thereby reduce the coating thickness.

At the point 5 where the blade edge contacts the phototool, the instantaneous pressure may reach 300 pounds per square inch (2067 kPa). This high pressure causes any trapped air bubbles to burst and the air is forced out ahead of the blade.

Experiments with the substitution of a rubber roller in the manner of U.S. Pat. No. 3,837,887—K. Akamatsu et al., Sept. 24, 1974 in lieu of the blade yielded inferior results, for air was entrapped under the phototool.

On those areas of the phototool now mated with the (crosshatched) photopolymer, a strong holding force is maintained between the phototool and PWB surface. Thus, atmospheric pressure 11 (FIG. 1) maintains the phototool in intimate contact with the photopolymer surface indefinitely, without an outside vacuum source. Phototool opaque areas 7 (which usually do not constitute surface irregularities) are in intimate contact with the photopolymer surface, and the photopolymer can be exposed with a non-collimated light source and produce high fidelity reproduction of images on the phototool on the PWB plating resist pattern.

Figure 2:
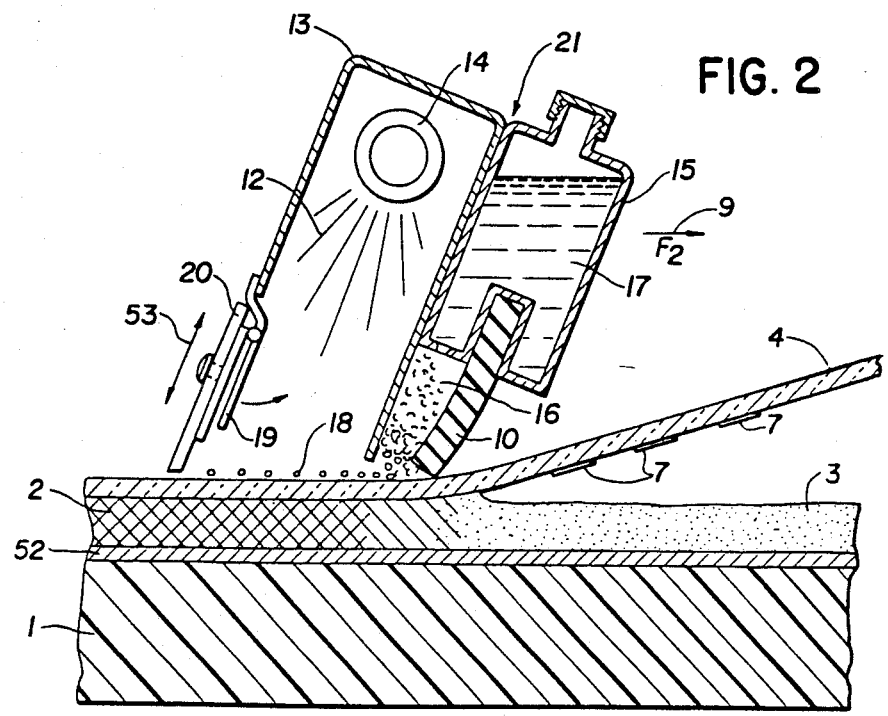
FIG. 2 is a further similar sketch illustrating the mating during an exposure step wherein a coolant dispenser and tubular lamp are co-mounted to protect the photo image from excess heat and expose the photopolymer all on one scan.

FIG. 2 shows a preferred method for curing photopolymer 3. For this purpose, UV lamp 14 and reflector-focuser 13 are mounted on the same movable transversing assembly 21 as blade 10. After the blade causes the phototool to mate with the photopolymer, light rays 12 expose and polymerize the photopolymer layer 2 directly beneath the phototool transparent areas. Light rays 12 cannot expose those areas ahead of blade 10.

FIG. 2 shows the coolant dispensing apparatus; reservoir 15, supplying coolant 17 to sponge 16 and thence to phototool 4 in a film shown as droplets 18. Shuttering is accomplished automatically by pivoted shutter 19 as the assembly 21 is lowered into contact with phototool 4. Light shroud 20 contacts phototool 4 and slides upward along the reflector-focuser 13, and actuates the pivoting shutter 19 which opens to expose the mated photopolymer. Arrow 53 shows the reciprocal movement of the transversing assembly to move from rest into engagement on transversal and then back into a spaced separation position from the photopolymer layer 3.

FIG. 2 shows 3 distinct zones or conditions of photopolymer. Photopolymer 2 under lamp 14 is polymerized as shown by crosshatching, while photopolymer 2 under sponge 16 is under vacuum but not yet exposed as indicated by lining; photopolymer 3 is not yet contacted by phototool 4 and is therefore at atmospheric pressure as indicated by dotting. This progressive exposure method is an advancement in the art of producing printed plates with photopolymers, since present systems require a time of several seconds for drawdown of the entire phototool before the exposure begins as for example in the aforementioned U.S. Pat. No. 4,070,110. Similarly vacuum drawdown techniques are costly and time consuming. Since the disclosed system requires no external vacuum and exposes during scanning, this drawdown period and equipment is eliminated.

The following sections describe the preferred phototool construction techniques to image the major photopolymer resists in use in PWB manufacture and photopolymers used in graphics imaging.

Photoresists

Representative photoresists and manufacturers are listed below:

| Manufacturer | Product Code | Description |
| --- | --- | --- |
| M & T Chemicals, Inc. Rahway, N.J. | CNF1110 311LV | Plating Resist Solder Mask |

These photoresists have been developed to be screen printed to a thickness of 1 to 2 thousandths of an inch (0.025 mm to 0.05 mm), and cured by a two-lamp assembly, each lamp rated at 200 watts per linear inch (2.54 cm), with a conveyor speed of 12 feet per minute. With the disclosed equipment the phototool is placed between the lamp and PWB, subjecting the phototool to temperature ranging up to 300 degrees F. While the phototool temperature can be reduced to less than 100 degrees F. by utilizing a different lamp source and increasing the exposure time to the order of 40 seconds, the preferred embodiment is the use of polyester sheet and a high temperature silicone rubber layer to bond the opaque areas 7 (FIG. 1) to the sheet 4; and the use of a liquid coolant on the surface of the sheet.

Phototool

Referring to FIG. 1, phototool 4 is seen to be subjected to a horizontal force 9 which tends to stretch the phototool and thereby introduce registration errors. Polyester sheet in the thickness of 4 to 8 thousandths of an inch (0.1 to 0.2 mm) provides the stability needed by the photorool, plus the ability to withstand short temperature excursions to 250 degrees F. Phototool opaque areas consist of etched metal foil, preferably aluminum.

The flexible polyester sheet phototool 4 is coated over the foil surface with silicone rubber adhesive, Dow Corning product code 734 RTV, which serves two major functions. First, the resilient rubber can accommodate small dirt particles on the PWB surface. During the mating cycle PWB surface irregularities can cause a separation to exist between phototool and PWB surface which will mar the image over a much wider area than the irregularity itself. The silicone rubber, being resilient, conforms to the irregularity and reduces the marred area. Secondly, the silicone rubber adhesive forms a non-stick surface on the phototool to which hardened photopolymer will not adhere.

While a silicone rubber adhesive is the preferred bonding material for the foil coating, other materials can be used. Polyethelene was used in tests conducted by the applicant, with good results. Polyethylene provides a non-stick surface and has the added advantage of providing a suffice which does not dewet when coated with photopolymer. However, polyethylene is thermoplastic and if subjected to temperatures of 250 degrees F. can melt and react with the photopolymer and thereby damage the phototool.

The phototool can also be made from polyester photographic film having either a silver halide emulsion or a diazo emulsion, with a suitable non-stick surface added. The aforementioned heat build up in large opaque areas may distort and damage this type of phototool.

Thus far in this disclosure, the use of a flexible phototool has been described. The phototool need not be flexible in all cases. For example, when imaging flexible printed wiring circuits, the phototool may be a glass plate and the flexible substrate mated with the phototool by drawing the blade across the flexible substrate.

Phototool Cooling

Depending on exposure time and distance of phototool from UV lamps, the temperature rise of the phototool can be up to 300 degrees F. and beyond. There are two practical techniques for reducing substrate temperature rise in conventional UV lamp conveyorized systems. First, the UV lamps can be water-jacketed to reduce convected thermal transfers and non-functional infra-red radiations. However, the cooling water must be distilled and exceptionally free of minerals and other impurities, which could reduce light output. The cost of piping and a stainless-steel heat exchanger is prohibitive.

A second technique for substrate cooling is to force cold air, at 30 degrees F. onto the substrate while under the UV lamp. This cooling technique is expensive and wasteful of energy.

A water spray on printed substrates to prevent overheating presents the hazard of water impinging on the hot lamp surface and causing catastrophic damage.

This disclosure teaches a way of introducing a liquid coolant onto the phototool surface at the trailing edge of the mating blade. A 50 percent water-alcohol solution is applied across the width of the phototool by a sponge. While many liquids can be used, it is necessary that the phototool be wetted completely and beading of coolant prevented. The coolant absorbs heat from the phototool by evaporation, yet does not significantly reduce the transmittance of the UV light energy. The alcohol-water solution will keep the phototool temperature to 200 degrees F. or lower.

As shown in FIG. 2, reservoir 15 contains the coolant solution, which is applied to phototool 4 by sponge 16. When two successive lamps are used, coolant film shown as droplets 18 is partially evaporated by the first lamp 14, and remain in diminished quantity to provide phototool cooling when passing under the second UV lamp.

Coolant solution is introduced after the mating blade, as the solution would be forced ahead of the blade if introduced there.

Light Source

In FIG. 2, UV light source 14 is a commercially available medium pressure mercury vapor lamp, whose length is chosen to correspond to the width of the substrate to be imaged. One suitable lamp is manufactured by Canrad-Hanovia Company of Newark, N.J. The lamp is mounted in irradiator 13, FIG. 2, which is manufactured by the same company.

Imaging Sequence

The following chart shows the process steps of this invention to be followed where hole tenting is not required.
  a. prepare phototool and install in the fixture.
  b. coat the drilled PWB with paste photopolymer.
  c. install PWB in registration on the fixture.
  d. mate the phototool with the PWB to form a sandwich.
  e. expose the PWB to UV light through the phototool.
  f. separate the phototool from the PWB leaving hardened photopolymer on PWB.
  g. wash out unexposed paste photopolymer on PWB and post cure if desirable.
  h. blot the phototool to remove any photopolymer paste adhering thereto, and reinstituting the cycle.

Step 2, phototool preparation is accomplished as previously described.

The PWB is coated, Step b, by screen printing to the desired thickness, normally from 0.5 to 2 thousandths of an inch (0.013 mm to 0.051 mm), as determined by plating bath requirements (temperature, immersion time, plating current density and chemical composition), and the plating thickness to be deposited. The photopolymer thickness is controlled primarily by the screen fabric thickness and percent open area. For example, a 156 mesh polyester fabric will coat the PWB to a thickness of approximately 1 mil, while a 230 mesh fabric will deposit a coating 0.3 mils (0.076 mm) thick.

The phototool is maintained by off-contact, but correctly positioned above the coated PWB. Off contact distance is of the order of 0.060 inches (0.15 cm) for a 12 by 18 inch (0.3 by 0.46 M) PWB.

The phototool is mated with the coated PWB by pressing the blade down at one end of the PWB and drawing the blade across the PWB length, using a downward force of 2 pounds (0.89 KG) per linear inch (2.54 cm) of blade length.

Step e, exposure to UV light source, may be accomplished concurrently with the phototool mating Step d. Alternatively, the positioning fixture (with mated phototool) may be exposed to a remote light source. As previously described, the mating process forces out all air from the photopolymer, and all air from between the phototool and photopolymer surface, producing a vacuum. This vacuum is maintained indefinitely, provided the phototool does not start to lift away at the PWB edge in response to the upward pull of the phototool.

Thus, without the use of an external vacuum source, the mated phototool PWB can be exposed to various light sources to effect polymerization. While the preferred embodiment uses tubular mercury vapor lamps to effect exposure in several seconds under the lamps, a flip-top platemaker exposure system of lower power can be used for exposure, but the exposure time increases.

Other suitable lamp sources are the drawer type exposure units such as the COLIGHT DMVL-HP with exposure times of the order of 2 minutes.

The washout of unexposed photopolymer, Step f, is accomplished by using a solvent spray bath lasting from 10 to 30 seconds. The DuPont "A" Processor with trichlorethane is one combination of equipment and solvent which produced excellent quality images.

Step h, the blotting of the underside of the phototool is required to smooth out unexposed photopolymer which remains on the phototool after the exposed PWB is removed. If left on the phototool, then the next image may be marred by the presence of entrapped air. Usually it is necessary to blot the phototool after every second or third exposure cycle, depending on the photopolymer coating thickness on the PWB.

Blotting is accomplished by use of a rubber roller to obliterate the patterns and distribute the remaining photopolymer more evenly.

Where selected holes are to be tented by the photoimaged resist, the primary difference in the procedures for hole tenting is Step b, in which the phototool is coated rather than the PWB.

Another difference is that blotting the phototool is not necessary when tenting, since the next step, phototool coating, obliterates the residual photopolymer patterns.

As described earlier, the phototool has a thin layer of clear silicone rubber on the underside. When a coating of photopolymer is applied by screen printing (or other means) onto the silicone rubber, the photopolymer will develop "fish-eyes" or voids which will continue to expand in area with time. This is caused by the inability of the wet photopolymer to grip the silicone rubber, and the photopolymer surface tension causes the photopolymer to form beads, similar to the beading of water on a waxed surface.

In order to prevent the formation of fish-eyes or voids, the disclosed apparatus exposes or flashes the photopolymer through the phototool as the coating is being applied. This flashing step is of sufficient intensity to slightly polymerize the photopolymer over the clear areas of the phototool, but not to the point of exterior surface hardening. That photopolymer above the phototool opaque areas need not be flashed.

It would appear that this flashing step is critical with regard to lamp intensity and exposure time, but in practice it is not. The photopolymers listed in this disclosure, and all photopolymers tested are air-inhibited, meaning that the photopolymer cure with less UV energy in the absence of air than is required in the presence of air. Thus, as the phototool is coated with photopolymer via screen printing, only a thin line of photopolymer immediately under the squeegee is deprived of air, for the screen fabric is off-contact, and touches the phototool only along a line underneath the squeegee. Previously deposited photopolymer, though exposed, will retain a wet surface for good adhesion to the substrate to be printed.

This flashing technique is an important aspect of tenting holes in PWB resist imaging, for the flashing ensures a thicker film over the tented hole than would be attained without flashing, for without flashing the photopolymer would thin out at the edges of the holes and would be more likely to break down during washout and immersion in the plating solution.

This flashing step has produced a polymerized image which is hardened on the phototool side, but wet on the exterior side so that the next step of phototool mating with the substrate can be considered to be an image transfer technique.

Dry Film Photopolymer Imaging Sequence

The apparatus and procedures disclosed herein can also be used to image PWB using dry film photoimaging resists as manufactured by the DuPont Company and others. The following DuPont photopolymers are representative of those which can be mated and exposed as described herein: TYPE 6; 1105; 1010; X1135; 1020 and 310. The procedure shown in the foregoing chart a through f are followed as described for paste-consistency photopolymer, with the exception of the coating cycle, wherein the dry film photopolymer is laminated to the PWB by a heated roller laminator.

Using the disclosed mating and exposing apparatus, the resolution of dry film images can be significantly improved. This increased resolution is achieved by removing the protective polyester sheet which covers the dry film photopolymer prior to exposure. The manufacturer recommends leaving the polyester film in place during exposure and up to the time of development. However, the film, being 0.75 mils (0.019 mm) thick separates the phototool emulsion from the photopolymer surface during exposure and results in loss of image fidelity. When the cover sheet is removed, the unexposed dry film is tacky to the point that a phototool cannot be placed on the photopolymer and moved about to achieve register.

Mating and Exposing Apparatus

In arriving at the preferred embodiment substrates were imaged using three available production equipments modified as described. While these alternates do not provide the capability for coating, mating and exposing as readily as the preferred embodiment, they have high production capacities or other merits.

EXAMPLE No. 1

A substrate can be coated via screen printing, placed in the exposure fixture and imaged with a modified conveyorized UV curing unit, consisting of horizontal tubular UV lamps with a conveyor belt for moving substrates under the lamps. These UV curing units can be used for producing images per this disclosure by the addition of a mating blade assembly and phototool coolant-dispensing apparatus as shown in FIG. 2.

The UV curing unit is a standard 2 lamp system manufactured for example by Argus Manufacturing Inc. of Hopewell, N.J. or COLIGHT INC. of Minneapolis, Minn., modified to accommodate a traversing blade previously described.

The use of a modified UV-curing unit as an exposure source has two attributes not afforded by the preferred embodiment. First, the use of a modified UV curing unit permits a much higher rate of production, for many different types of images can be exposed sequentially with no UV curing unit changes. This allows a large production facility to coat PWB on multiple screen printers and to expose with a single high speed curing unit.

The second attribute of the use of UV curing unit is that substrates of exceptional length can be mated and exposed, obviating the need for oversize cabinetry.

EXAMPLE No. 2

The second alternative apparatus is the use of an automatic screen printer with modifications including the addition of a tubular lamp integrally mounted with the print bar assembly; a power supply; and coolant dispensing apparatus. Precision automatic printers, such as made by Autoroll, can maintain the required registration without the need for fixturing. The automatic printers can be used in two ways; with and without a positioning fixture. When used without the positioning fixture, the coated substrates are mated and exposed, with registration being maintained by the printer.

When used with the positioning fixture then a single printer can mate and expose different types of intermixed PWB's for high speed production.

EXAMPLE No. 3

The third alternative apparatus which can be used for exposure of mated substrates is the use of a platemaker, such as the units made by NUARC of Chicago, Ill. The non-stop platemaker has a cabinet-mounted lamp and a swivel top which allows one substrate to be exposed while a second substrate is being prepared on the top surface. When used as an exposure source for imaging as disclosed herein, an exposure fixture is mounted on each side of the flip-top; one exposure fixture for each side of a double sided PWB, for example. The substrates are coated on auxiliary equipment and mated manually. This alternative apparatus represents the least expensive method for imaging per this disclosure in a manual environment.

Advantages of the process afforded by this invention are numerous, and the characteristics of the materials synergistically relate to the photoimaging process by producing higher resolution at lower material cost, in shorter time, at lower energy cost, at lower temperatures and with less sensitive light sources.

For example, the U-V curable resists of the wet polymer type have been primarily used in screen printing techniques to print an image for photocuring. It is found in this invention that these resists can be exposed through phototransparencies to produce high resolution images.

The photoimaging method provides for a faster production method, since it is found that air in contact with the paste polymer surface inhibits photocuring. Thus, by covering the surface with the photoimage transparency energy density for photocuring is reduced to between 20 and 50 percent of that necessary for air exposed surfaces.

This effect is most important because of the effect of heat on phototransparencies. Also the effect on copper clad printed wiring boards is important. Reductions of energy then also make the end products much more reliable and prevents distortions that affect resolution. For example, a photocured PWB might rise in temperature from 75° to 250° F. when exposed to tubular mercury vapor lamps for photoimaging. Lower energy requires less exposure time.

Further significant time is saved in development as compared with hard photopolymers, soft unexposed paste polymer can be washed out in the development stage in ten seconds. Hard polymers require a minute or more, and also resolution suffers. The ratio of hardness to softness for exposed to unexposed polymer is much higher for paste polymers than the dry film polymers. This in part results in potential resolutions of line widths of 0.005 inches (0.013 cm) in dry films as compared with 0.001 inches (0.0025 cm) with paste polymers which give better boundaries and less under-cutting.

The advantages of using non-collimated light with paste polymers permitting phototransparency direct contact are set out heretofore.

Resolution is increased with thinner layers as is development time and heat, etc. Dry film polymers are available in a few choices between 0.00075 to 0.0015 inches (0.0019 to 0.0038 cm) whereas the paste photopolymers can be screen printed at any thickness between 0.0002 to 0.002 inches (0.0005 to 0.005 cm).

Other processing steps required in dry film photoimaging can be completely eliminated at significant time and energy savings. Thus, dry film requires heat and pressure to laminate at 200° F. It must then be held 15 minutes before exposure to stabilize. Again exposure heats the film and it must be cooled and held at ambient temperature for about 15 minutes before developing. Otherwise clean developing cannot be achieved. With the paste polymers, coating, exposure and developing proceeds in less than one minute without waiting time.

Having therefore set out the construction and operation of a preferred embodiment of the invention and advanced the state of the art, these features of novelty believed descriptive of the spirit and nature of the invention are set forth with particularity in the appended claims.

Industrial Application

There is provided an improved process and apparatus for making precision photoimages particularly useful in the production of printed wiring circuits, where a resist image is put on a copper-clad board to limit the plated metal to those areas which will become electrical conductors.

Thus, a UV curable photopolymer of paste-consistency is applied over the board surface and selectively exposed through a phototool in contact with the wet photopolymer, producing a hardened resist pattern which withstands the subsequent solvent wash-out step.

Additionally, the disclosed process and apparatus provides an improvement in half-tone dot printing, particularly for substrates heretofore imaged by screen printing.

I claim:

1. The method of producing from liquid photopolymers a photo curable polymer image developing medium of high fidelity capabilities when exposed through a photoimage from a non-collimated radiation energy source photoactively curing said photopolymer, comprising the steps of:
    (a) disposing on a first carrying surface a substantially constant thickness thin film layer of non-volatile image-quality liquid photopolymer with a paste like consistency of a thickness less than about 0.002 inches (0.05 mm),
    (b) retaining a second carrying surface in substantially parallel relationship to the first surface with the photopolymer therebetween to position between the two surfaces said photopolymer thin film layer of substantially constant thickness and confining the photopolymer layer in air excluding contact between the first and second carrying surfaces,
    (c) disposing on one of said carrying surfaces before contacting the photopolymer therewith said photoimage comprising a light contrasting image transparency pattern thereby for an air excluding surface contact forming said image developing medium from said thin photopolymer film with said photoimage in contact with one said surface to be disposed between said two carrier surfaces in said air excluding contact with the paste-like photopolymer layer, and
    (d) exposing said polymer image developing medium through said photoimage to form in said polymer image developing medium a corresponding pattern of resolution substantially greater than 105 lines per inch by selectively curing and hardening portions of the photopolymer film layer.

2. The method defined in claim 1 including the steps of (e) removing one of said carrying surfaces, and (f) washing out uncured liquid photopolymer to leave on the remaining carrying surface a developed image wherein one of said carrying surfaces comprises a substrate forming a printed wiring board, including the step of leaving the cured photopolymer in place on the printed wiring board surface as a solder mask layer.

3. The method defined by claim 1 including the step of disposing the image transparency on said second carrying surface comprising a flexible transparent thin film carrying surface and further reusing the image transparency over and over in producing products by the method defined.

4. The method defined by claim 1 including the steps of providing the image transparency on a flexible thin film comprising one of said carrier surfaces and stripping the flexible thin film image transparency from the paste consistency photopolymer without damage to the image transparency for repeated use in a plurality of image developing cycles.

5. The method defined by claim 1 including the step of exposing the liquid photopolymer film to said radiation through said image transparency to securely affix to the other said surface an image corresponding to that on the photoimage formed by a cured and hardened pattern of the photopolymer in an overall time period of less than one minute.

6. The method defined by claim 1 wherein the step of disposing the second carrying surface comprises laminating a flexible thin film as said second carrying surface to the surface of the photopolymer by scanning a laminating member across said thin film second carrying surface to force said image into said air excluding contact with the photopolymer film layer for self-adhesion thereto thereafter.

7. The method defined in claim 1 including the steps of first contacting the photoimage carrying surface with the liquid photopolymer layer and exposing the photopolymer layer to radiation to partially polymerize the photopolymer layer in contact with the transparency thereby to prevent dewetting on the photoimage surface, and thereafter contacting the photopolymer layer with the other carrying surface.

8. The method defined in claim 1 including the steps of exposing in less than a minute the liquid photopolymer to radiation through the image transparency to cure a corresponding image pattern adhered to the carrying surface at a temperature less than 200° F., stripping the carrying surface having the image transparency thereon from the photopolymer layer and reusing the image transparency on its carrying surface cyclically for exposing the further successive layers.

9. The method defined in claim 6 including the step of laminating a constant thickness photopolymer film layer of a thickness between 0.00025 inch (0.006 mm) and 0.002 inch (0.05 mm) deposited by a screen printing step onto one said carrier surface before scanning with a screen fabric thickness selected to control the thickness of the photopolymer layer between said two carrier surfaces being performed by said scanning step.

10. The method defined in claim 1 wherein the liquid polymer is hardened by exposure to radiation, the second carrying surface is formed by a flexible transparent film having superimposed thereupon said image transparency and the first carrying surface is a printed wiring board substrate having holes drilled therethrough, including the steps of covering the holes with said paste-like consistency photopolymer layer, registering opaque image portions with the drilled holes, exposing the photopolymer layer by radiation passing through said image transparency to harden the photopolymer in only the transparent parts of the image, and washing out the unhardened liquid photopolymer remaining in the holes.

11. The method defined in claim 1 including the step of disposing the photopolymer on one of the carrier surfaces by means of screen printing through a mesh determining a predetermined layer thickness.

12. The method defined in claim 1 with the carrier surface carrying the photoimage comprising a transparent flexible thin film layer, including the steps of stripping the flexible carrier surface having the image transparency thereon by peeling off from the photopolymer layer after exposure to radiation, blotting the image transparency surface to smooth out any liquid photopolymer remaining on the image transparency surface, and reusing the image transparency for another photo cycle.

13. The method defined in claim 1 including the steps of forming a layer of the liquid photopolymer first on the image transparency surface, and then forming a sandwich with the liquid photopolymer layer between the two carrying surfaces with the remaining carrying surface comprising a substrate having holes therein which are thereby tented over by the photopolymer layer.

14. The method defined in claim 1 including the steps of applying on the image transparency surface a thin layer of material preventing the photopolymer from sticking thereto before the photopolymer engages that surface, depositing the layer of liquid photopolymer on that surface and flash exposing the layer by radiation through the image transparency to partially cure the layer before exposing the photopolymer layer to curing radiation through said image transparency.

15. The method defined in claim 14 wherein the flash exposure is made in the presence of air on the liquid photopolymer layer.

16. The method of producing high resolution image reproduction above 105 lines per inch with photopolymer films comprising the steps of disposing an image transparency on one surface of a transparent body, laminating in a sandwich form on both sides of a thin film layer of paste-like consistency liquid photopolymer of substantially constant thickness no greater than 0.002 inches (0.05 mm) in air free surface contact two carrier surfaces, one of which is the image transparency on the transparent body in direct adhering contact with the photopolymer layer, and exposing the photopolymer layer by radiation through said transparent body and image transparency surface to produce an image of higher resolution than 105 lines per inch.

17. The method defined in claim 16 wherein said transparent body is a flexible thin film layer including the steps of positioning the flexible thin film layer close to but out of contact with the photopolymer layer, and progressively scanning a member across the transparent body to move the transparency and body into self-adhering contact over the liquid photopolymer layer surface in air excluding engagement therewith.

18. The method defined in claim 16 including the steps of screen printing said constant thickness layer on the transparent body in air free contact with the image transparency, and partially precuring the photopolymer layer disposed on the substrate by radiation on a photopolymer surface exposed to air before laminating to the other said carrier surface.

19. The method of photoprinting with non-volatile image quality liquid photopolymers of paste-like consistency comprising the steps of producing a phototool image pattern of a configuration defining a predetermined pattern for corresponding control of a radiation pattern for curing the photopolymer on a flexible thin film transparent carrier surface, disposing a constant thickness layer of said liquid photopolymer of a thickness less than about 0.002 inches (0.05 mm) on the surface of a printed wiring board clad with copper conductive material, pressing said phototool into direct self-adhering air-excluding contact with the surface of said liquid photopolymer, exposing and curing the photopolymer layer by directing radiation through the phototool onto the surface of said liquid photopolymer, removing said tool by peeling off the flexible film from the photopolymer surface, and developing the photopolymer image by removing uncured photopolymer.

20. The method defined in claim 19 including the steps of defining a solder mask coating by the phototool pattern to cure and harden the photopolymer coating in place over the copper conductive material.

21. The method defined in claim 20 wherein the printed wiring board has holes therethrough including the step of registering an opaque phototool pattern portion with the holes to prevent curing of the photopolymer in the regions about the holes.

* * * * *